United States Patent [19]
Tustaniwskyj et al.

[11] Patent Number: 6,074,219
[45] Date of Patent: Jun. 13, 2000

[54] ELECTROMECHANICAL SUBASSEMBLY INCLUDING A CARRIER WITH SPRINGY CONTACTS THAT EXERT LARGE AND SMALL CONTACT FORCES

[75] Inventors: Jerry Ihor Tustaniwskyj, Mission Viejo; Leonard Harry Alton, Escondido, both of Calif.

[73] Assignee: Unisys Corporation, Blue Bell, Pa.

[21] Appl. No.: 09/114,416

[22] Filed: Jul. 13, 1998

[51] Int. Cl.[7] ........................................... H01K 9/09
[52] U.S. Cl. ................................................... 439/66
[58] Field of Search ..................... 439/66, 71, 68–73, 439/525

[56] References Cited

U.S. PATENT DOCUMENTS 5,152,694  10/1992  Bargain ..................................... 439/66
5,388,998   2/1995  Grrange et al. ........................... 439/66
5,473,510  12/1995  Dozier et al. ............................. 439/66
5,791,914   8/1998  Loranger et al. ......................... 439/71

*Primary Examiner*—Renee Luebke
*Assistant Examiner*—J F. Duverne
*Attorney, Agent, or Firm*—Charles J. Fassbender; Mark T. Starr; Steven B. Samuels

[57] ABSTRACT

An electromechanical subassembly is comprised of a carrier having a body with a planar surface and multiple holes that extend from the planar surface into the body. A plurality of springy contacts are held in the holes; and they extend, in an uncompressed state, past the planar surface. The plurality of springy contacts include contacts of a first type which each exert a relatively small opposing force when compressed to the planar surface, and contacts of a second type which each exert a substantially larger opposing force when compressed to the planar surface.

15 Claims, 8 Drawing Sheets

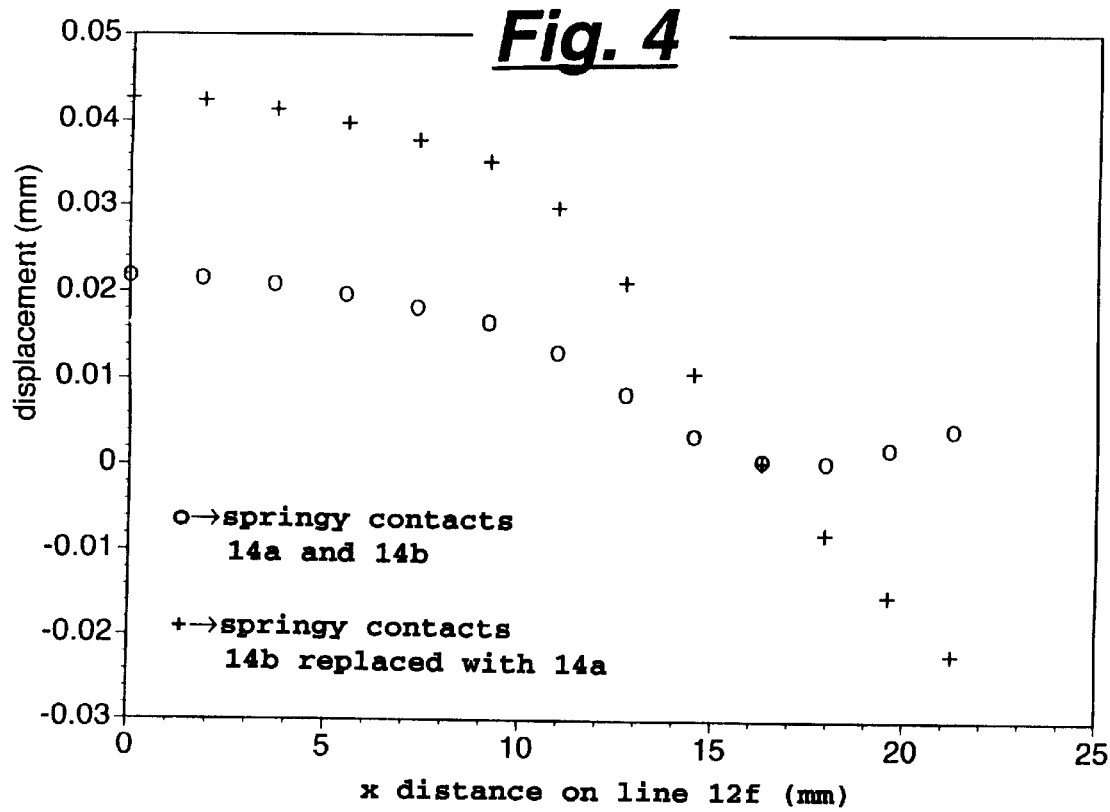
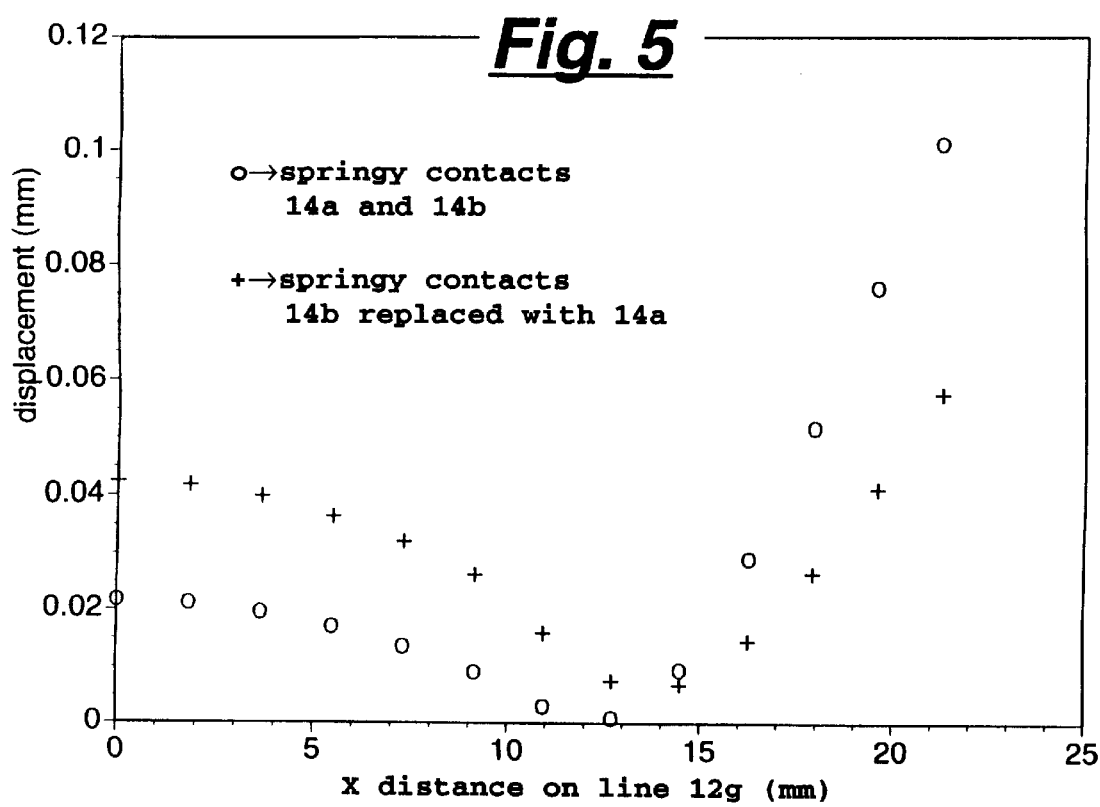

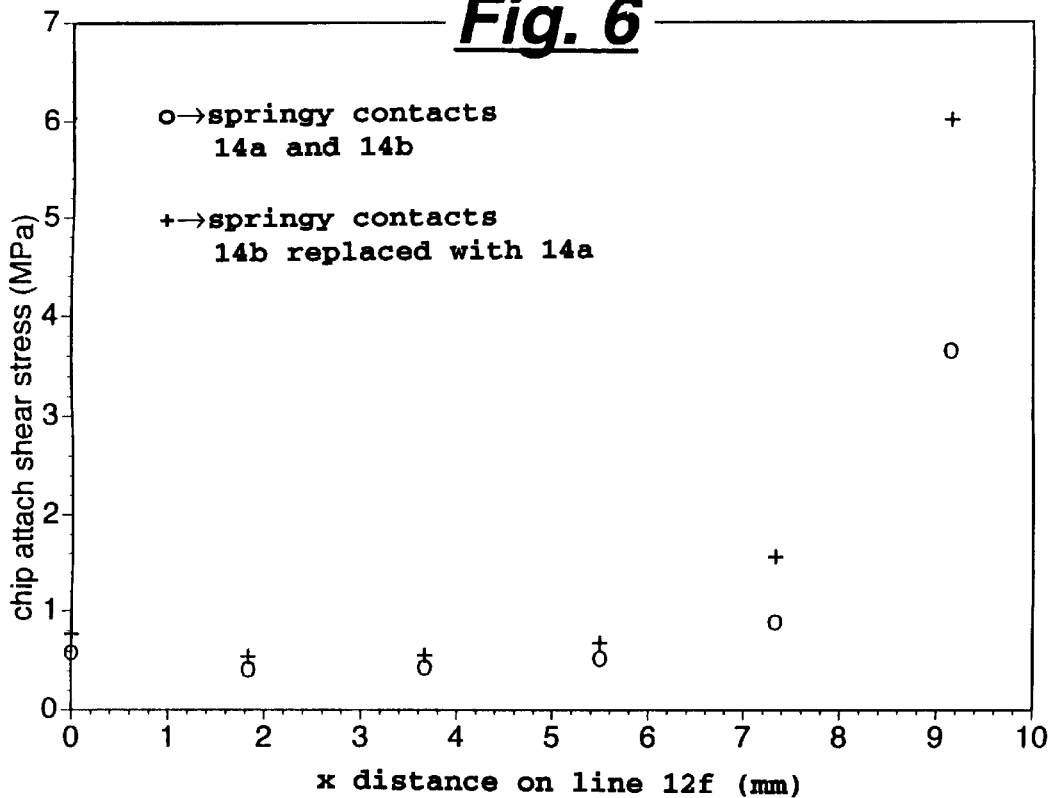
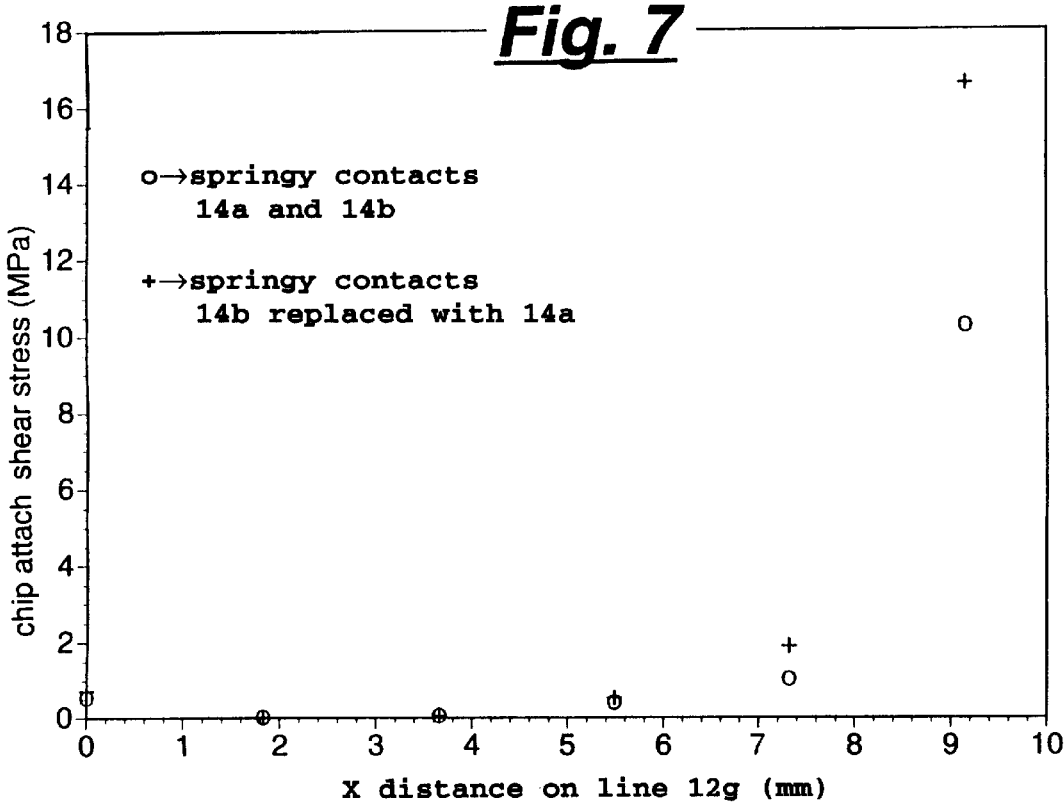

ELECTROMECHANICAL SUBASSEMBLY INCLUDING A CARRIER WITH SPRINGY CONTACTS THAT EXERT LARGE AND SMALL CONTACT FORCES

RELATED CASES

The present invention, as identified by the above title, is related to another invention which is described herein with one common Detailed Description. This related invention is identified as Docket 550,595 entitled "Integrated Circuit Module Having Springy Contacts of At Least Two Different Types for Reduced Stress" having U.S. Ser. No. 09/114,417.

BACKGROUND OF THE INVENTION

This invention relates to integrated circuit modules and subassemblies of the kind which include springy contacts that are compressed to make electrical connections between two components.

In the prior art, an example of an integrated circuit module that uses compressed springy contacts to make electrical connections is disclosed in U.S. Pat. No. 4,999,023 which is entitled "High Density Low Reactance Socket." There, in FIGS. 2A and 2B, a springy contact is indicated by reference numeral 15. This springy contact 15 is comprised of a wad of wire that is held by a sleeve 14.

In FIGS. 2A and 2B of patent '023, the springy contact 15 is used to make an electrical connection between an input/output pin 20 on a packaged integrated circuit chip and a signal line 32 on a printed circuit board. This electrical connection is made by inserting the pin 20 into the sleeve 14 and pushing the pin against the springy contact 15.

When the pin 20 is pushed into the sleeve 14, the springy contact 15 is compressed parallel to the axis of the pin; and that causes the springy contact to expand perpendicular to the axis of the pin and press against the side wall of the sleeve 14. This establishes a low resistance electrical connection through the side wall of the sleeve 14 to the signal line 32.

Each springy contact 15 which is compressed exerts an opposing force against its corresponding input/output pin 20. Thus, as the total number of input/output pins 20 on a component increases, the total opposing force which is exerted on the component by all of the springy contacts 15 also increases.

As a numerical example, suppose that a component has one thousand input/output pins and each springy contact exerts an opposing force of two ounces. For that case, the total opposing force against the component is over one hundred pounds.

By increasing the total opposing force with which all of the springy contacts push against a component, a point can eventually be reached where the component will deflect or bend. If that occurs, mechanical stress is generated in the component; and this stress can produce permanent damage. For example, the stress can cause an immediate break in a microscopic signal line in or to the component; or, the stress can weaken a joint in or to the component and thereby cause a long term reliability risk.

Accordingly, a primary object of the present invention is to provide an improved electromechanical subassembly which holds springy contacts in a novel fashion such that the above stress problem is overcome.

BRIEF SUMMARY OF THE INVENTION

The present invention is an electromechanical subassembly which includes a carrier having a body with a planar surface and multiple holes that extend from the planar surface into the body. Also, a plurality of springy contacts are held in the holes, and they extend in an uncompressed state past the planar surface. Further, in accordance with the present invention, the springy contacts include contacts of a first type which each exert a relatively small opposing force when compressed to the planar surface, and contacts of a second type which each exert a substantially larger opposing force when compressed to the planar surface.

One particular use of the above subassembly is in making pressed connections to an integrated circuit chip such that the chip is not over stressed. This can occur, for example, where the chip has multiple input/output terminals that are soldered to one surface of a thin planar substrate; the terminals are connected within the substrate to I/O pads on an opposite surface of the substrate; and the I/O pads are pressed against the springy contacts in the subassembly.

When the I/O pads are pressed against the springy contacts, those contacts will exert an opposing force which can bend the substrate; and, such bending can break or degrade the soldered connections to the input/output terminals of the chip. However, by providing the springy contacts of the first type and the second type in the carrier, the maximum bending of the substrate can be greatly reduced, in the critical region where the chip is soldered to the substrate, over that which will occur if all of the springy contacts exert the same magnitude force against its respective I/O pad.

BRIEF DESCRIPTION OF THE DRAWINGS

FIG. 4 is a computer plot which illustrates in detail how the substrate in FIG. 1 bends along a centerline, with and without the present invention.

FIG. 5 is a computer plot which illustrates in detail how the substrate in FIG. 1 bends along a diagonal line, with and without the present invention.

FIG. 6 is a computer plot which illustrates the chip attach shear stress which is generated by the bending in FIG. 4.

FIG. 7 is a computer plot which illustrates the chip attach shear stress which is generated by the bending in FIG. 5.

DETAILED DESCRIPTION

Figure 1:
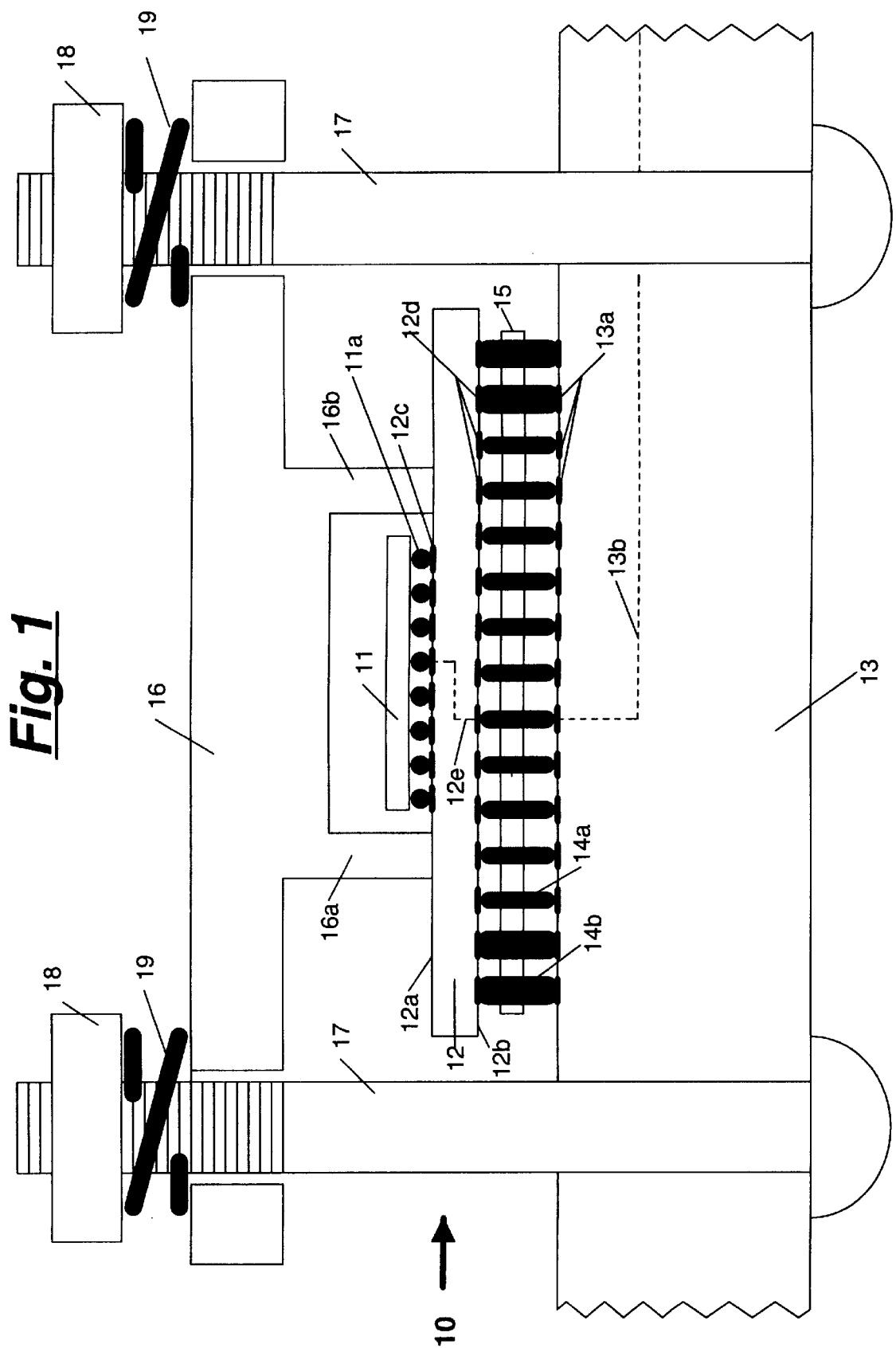
FIG. 1 shows an electromechanical module which constitutes one preferred embodiment of the present invention.

Referring now to FIG. 1, an electromechanical module 10 which constitutes one preferred embodiment of the present invention will be described in detail. This electromechanical module 10 is comprised of several components 11–18, and each of those components is listed and described below.

| COMPONENT | DESCRIPTION |
| --- | --- |
| 11 | Component 11 is an integrated circuit chip which has multiple input/output terminals 11a. In FIG. 1, the input/output terminals 11a are shown as solder balls as an example. |
| 12 | Component 12 is a thin planar substrate which has a top surface 12a and a bottom surface 12b. All of the input/output terminals 11a of the integrated circuit chip 11 are attached to respective I/O pads 12c on surface 12a of the substrate 12. Within the substrate 12 are a plurality of electrical conductors which connect the input/output terminals 12c to respective I/O pads 12d on the bottom surface 12b of the substrate 12. One such conductor is indicated by reference numberal 12e. |
| 13 | Component 13 is a printed circuit board, and it has a plurality of I/O pads 13a that align with the I/O pads 12d on the substrate 12. Each I/O pad 13a is connected to a respective electrical conductor 13b (only one of which is shown) which lie within the printed circuit board 13. |
| 14a and 14b | Components 14a and 14b are springy contacts which are compressed to make electrical connections between the I/O pads 12d on the substrate 12 and the I/O pads 13a on the printed circuit board 13. A respective springy contact is provided for each of the I/O pads 12d. The springy contacts 14a and 14b are two different types. Each contact 14a exerts a relatively small force on the I/O pads which it contacts; whereas each contact 14b exerts a relatively large force on the I/O pads which it contacts. |
| 15 | Component 15 is a carrier which holds all of the springy contacts 14a and 14b such that they are aligned with the I/O pads 12d and 13a. This carrier 15 has two planar surfaces with multiple holes that extend from one surface to the other. The carrier 15 is made of an electrical insulator, such as plastic; and the springy contacts 14a and 14b are held in the holes of the carrier as shown in FIG. 1 by friction. Preferably, the springy contacts 14a and 14b in their uncompressed state extend past each planar surface of the carrier 15 by less than one-tenth of an inch. |
| 16–19 | Components 16, 17, 18, and 19 together constitute a compressing mechanism which compresses the springy contacts 14a and 14b. Component 16 has four legs which surround the integrated chip 11 and rest on surface 12a of the |

-continued

| COMPONENT | DESCRIPTION |
| --- | --- |
| | substrate 12. Two of these legs are indicated in FIG. 1 by reference numerals 16a and 16b. Each component 17 is a bolt which passes through a hole in the printed circuit board 13 and a hole in component 16. Each component 18 is a nut which screws onto one of the bolts 17. Each component 19 is a coil spring which fits onto one bolt 17 and is compressed by one nut 18. |

One particular feature of the FIG. 1 electromechanical module is that the integrated circuit chip 11 and its substrate 12 can be easily removed and replaced. To remove the integrated circuit chip 11 and its substrate 12 from the FIG. 1 module, the nuts 18 are unscrewed from the bolts 17; components 19 and 16 are removed from the bolts 17; and the chip 11 together with the substrate 12 are lifted off of the springy contacts 14a and 14b. Then, to put another chip into the FIG. 1 module, that chip together with its substrate 12 are placed on the springy contacts 14a and 14b; component 16 is placed on the substrate 12 such that its legs surround the chip; the springs 19 are slipped onto the bolts 17; and the nuts 18 are tightened on the bolts 17 to a predetermined torque.

As the nuts 18 are tightened, the component 16 and the printed circuit board 13 move towards each other; and consequently, the springy contacts 14a and 14b get compressed into the holes of the carrier 15. Various forces are exerted on the substrate 12 by the legs of component 16 and by the compressed springy contacts 14a and 14b; and the locations of these forces on the substrate 12 are illustrated in FIG. 2.

Figure 2:
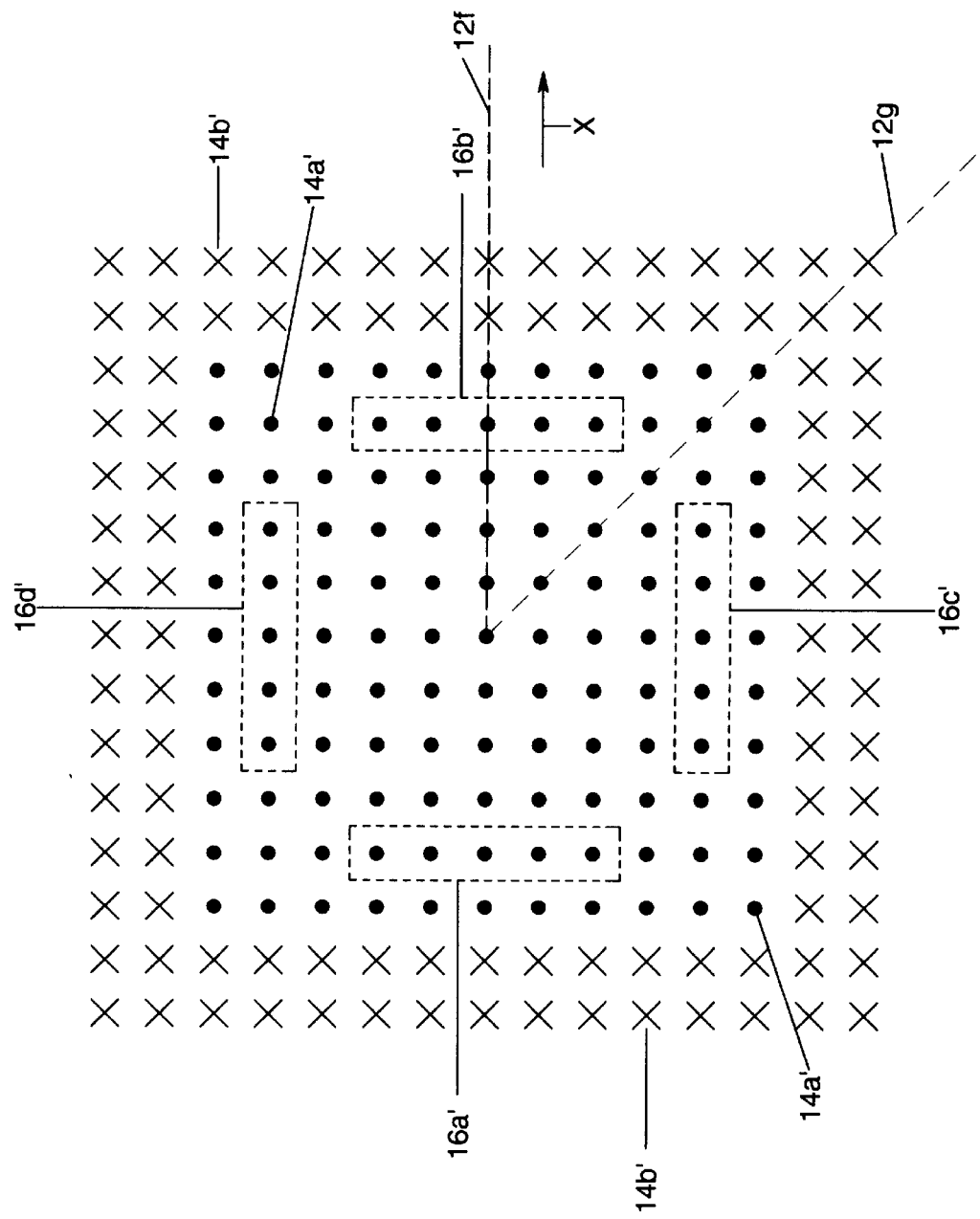
FIG. 2 shows the locations where various forces are applied to a substrate within the FIG. 1 module such that the bending of the substrate is reduced via the present invention.

In FIG. 2, the location of the forces which are exerted on the substrate 12 by the legs of component 16 are indicated by four rectangles 16a', 16b', 16c' and 16d'. Leg 16a exerts the force in rectangle 16a'; leg 16b exerts the force in rectangle 16b'; etc. Likewise, in FIG. 2 the forces which are exerted on the substrate 12 by the springy contacts 14a and 14b are indicated by dots 14a' and x's 14b'. Each force at a dot 14a' is a relatively small force which is exerted by a springy contact 14a; and each force at an x 14b' is a relatively large force which is exerted by a springy contact 14b.

Due to all of the forces which are applied to the substrate 12 as shown in FIG. 2, that substrate will bend. However, by utilizing two types of springy contacts 14a and 14b which respectively exert a small force and a large force on the substrate 12, the maximum deflection of the substrate 12 beneath the chip 11 is less than that which will occur if all of the springy contacts exert the same magnitude force against the substrate. Consequently, the potential for damage to the chip and/or its connections due to stress is reduced.

Figure 3A:
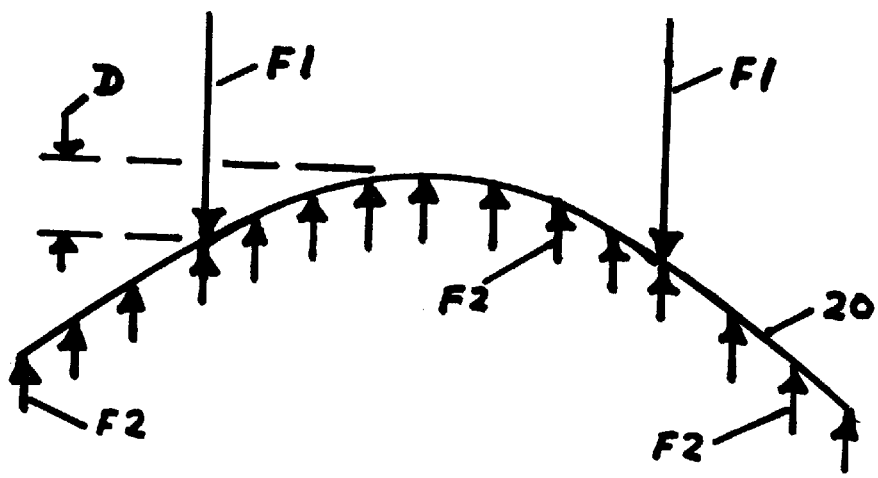
FIGS. 3A and 3B are schematic diagrams which illustrate the general concept of how bending is reduced in the substrate in FIG. 1 via the present invention.
Figure 3B:
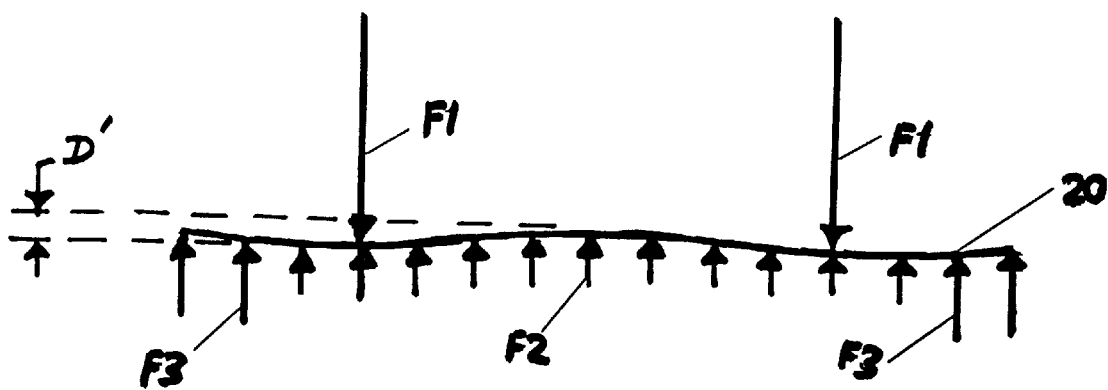

The principle which causes this reduced deflection under the chip 11 is illustrated schematically in FIGS. 3A and 3B. There, reference numeral 20 indicates a beam to which several forces F1, F1, and F3 are applied. This beam 20 represents the substrate 12 in FIG. 1; and the two forces F1 represent the forces which are exerted by the legs 16a and 16b on the substrate 12. These two forces F1 are separated because the legs 16a and 16b in FIG. 1 are separated by the chip 11. Also in FIGS. 3A and 3B, the forces F2 represent the small forces which are exerted on the substrate 12 by the springy contacts 14a in FIG. 1; and the forces F3 represent the large forces which are exerted on the substrate 12 by the springy 14b of FIG. 1.

If only the forces F1 and F2 are applied to the beam 20 as shown in FIG. 3A, the center of the beam is deflected upward relative to the points where the forces F1 touch the beam, and the ends of the beam are deflected downward relative to those same points. By comparison, when the forces F1, F2, and F3 are applied to the beam 20 as shown in FIG. 3B, the larger forces F3 have the effect of bending the ends of the beam upward. This, in turn, causes the center of the beam to be deflected less in the upward direction. Consequently, the peak deflection D' which occurs in the beam 20 of FIG. 3B is less than the peak deflection D which occurs in the beam 20 of FIG. 3A.

To accurately determine the actual bending and actual stresses that occur in the substrate 12 of FIG. 1, a computer simulation was performed. The results of that simulation are shown in FIGS. 4, 5, 6, and 7. All of the parameters which were used to perform the simulation are listed below.

1) The substrate 12 was made of a printed circuit board material called FR4.
2) The size of the substrate 12 was 42.5 millimeters by 42.5 millimeters, and its thickness was 1.12 millimeters.
3) The I/O pads 12d were disposed on surface 12b of the substrate 12 in a 33 by 33 array.
4) The I/O pads 12d had a center to center spacing of 1.27 millimeters.
5) Each of the small force contacts 14a exerted a force of 1 ounce, or 0.28 Newtons, against the substrate 12.
6) Each of the large force contacts 14b exerted a force of 2 ounces, or 0.56 Newtons, against the substrate 12.
7) The integrated circuit chip 11 on surface 12a of the substrate 12 was 18.3 millimeters by 18.3 millimeters.
8) Component 16 had four spaced-apart legs which surround the integrated circuit chip 11 and press against surface 12a of the substrate 12.
9) Each leg of component 16 pushed against the substrate 12 in an area which was 1 millimeter wide and 25 millimeters long.
10) Each leg of component 16 was indented from an edge of the substrate 12 by 5 millimeters.

In FIG. 4, the "o" signs provide a plot of the deflections which occur along a line 12f in the substrate 12 during the above simulation. This line 12f in the substrate 12 is shown in FIG. 2. A deflection in FIG. 4 is positive if the deflected point is above the points where the legs 16a, 16b, etc. touch the substrate; otherwise the deflection in FIG. 4 is negative. For comparison purposes, the "+" signs in FIG. 4 provide a plot of the deflections which occur along the line 12f in the substrate 12 when the large force contacts 14b are replaced with the small force contacts 14a.

In FIG. 4, the deflections which are critical are those that occur under the integrated circuit chip 11. Those deflections occur where the distance x is less than 18.3÷2 millimeters. For that region, the peak deflection shown by the "+" signs is about 0.042 millimeters; and, the peak deflection D' shown by the "o" signs is about 0.022 millimeters. Thus, by using the small force contacts 14a and the large force contacts 14b in accordance with the present invention, the peak deflection under the chip is reduced by roughly (0.042–0.022)÷0.042, or about 47%.

Similarly, in FIG. 5, the "o" signs provide a plot of the deflections which occur along a line 12g in the substrate 12 during the above simulation. This line 12g in the substrate 12 is shown in FIG. 2. Here again, a deflection in FIG. 5 is positive if the deflected point is above the points where the legs 16a, 16b, etc. touch the substrate; otherwise the deflection in FIG. 5 is negative. Also in FIG. 5, the "+" signs provide a plot of the deflections which occur along the line 12g in the substrate 12 when the large force contacts 14b are replaced with the small force contacts 14a.

Again in FIG. 5, the deflections which are critical are those that occur under the chip 11 (i.e.-where x is less than 18.3÷2 millimeters). There, the peak deflection shown by the "+" signs and the peak deflection shown by the "o" signs are approximately the same as that which occur in FIG. 4. Consequently, with the present invention, the peak deflection under the chip is again reduced by about 47%.

Inspection of FIG. 5 also shows that at the perimeter of the substrate, the deflection indicated by the "o" signs is actually larger than the deflection indicated by the "+" signs. Thus when the large force contacts 14b are used with the small force contacts 14a, the deflection at the perimeter of the substrate is increased. However, this increased deflection at the perimeter of the substrate causes no damage because it occurs far away from the integrated circuit chip.

In FIG. 6, the "o" signs provide a plot of the shear stress that is generated during the above simulation which occurs along the line 12f in the soldered joints between the substrate 12 and the input/output terminals 11a of the integrated circuit chip 11. This shear stress is in units of Mega-Pascals (MPa); and it is generated by the deflections which are shown by the "o" signs in FIG. 4.

For comparison purposes, the "+" signs in FIG. 6 provide a plot of the shear stress which occurs at the same points as the "o" signs but under the condition where the large force contacts 14b are replaced with the small force contacts 14a. In FIG. 6, the peak shear stress shown by the "+" signs is roughly 6.0 MPa; whereas the peak shear stress shown by the "o" signs is less than 4.0 MPa. Thus, with the present invention, the peak shear stress along line 12f in the solder joints between the substrate 12 and the input/output terminals 11a of the integrated circuit chip 11 is reduced by about (6.0–4.0)÷6.0, or 33%.

Similarly, in FIG. 7, the "o" signs provide a plot of the shear stress that is generated during the above simulation along the line 12g in the soldered joints between the substrate 12 and the input/output terminals 11a of the integrated circuit chip 11. This shear stress is generated by the deflections which are shown by the "o" signs in FIG. 5.

For comparison purposes, the "+" signs in FIG. 7 provide a plot of the shear stress which occurs at the same points as the "o" signs but under the condition where the large force contacts 14b are replaced with the small force contacts 14a. Inspection of FIG. 7 shows that the peak shear stress shown by the "+" signs is about 17 Mpa, and the peak shear stress shown by the "o" signs is about 10.5 Mpa. Consequently, with the present invention, the peak shear stress along line 12g in the solder joints between the substrate 12a and the input/output terminals 11a of the integrated circuit chip 11 is reduced by about (17–10.5)÷17 or 38%.

Figure 8:
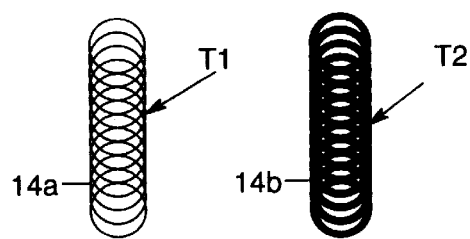
FIG. 8 illustrates one embodiment of the springy contacts which are in the FIG. 1 module and exert some of the forces that occur in FIG. 2.

Turning now to FIGS. 8–11, they show several embodiments of the springy contacts 14a and 14b. In FIG. 8, the springy contact 14a is comprised of a coil of wire which has a relatively small wire thickness T1, and the springy contact 14b is comprised of a coil of wire which has a relatively large wire thickness T2. Due to these different thicknesses, the springy contact 14a exerts a relatively small force on the I/O pads which it contacts; whereas the springy contact 14b exerts a relatively large force on the I/O pads which it contacts.

Figure 9:
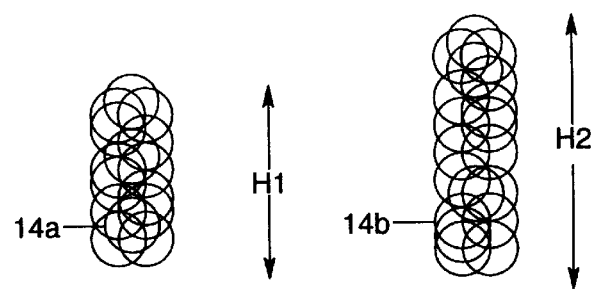
FIG. 9 illustrates a second embodiment of the springy contacts which are in the FIG. 1 module and exert some of the forces that occur in FIG. 2.

In FIG. 9, the springy contact 14a is comprised of a wad of wire which has a relatively small height H1; and the springy contact 14b is comprised of a wad of wire which has a relatively large height H2. Each wad includes one or more pieces of wire that are randomly bent and entangled into a springy mass. Due to the different heights of the springy masses, each contact 14a exerts a relatively small force on the I/O pad which it touches, whereas each contact 14b exerts a relatively large force on the I/O pad which it touches.

As one modification, the springy contact 14a in FIG. 9 can be comprised of a coil of wire (as opposed to a wad of wire) which has the small height H1, and the springy contact 14b in FIG. 9 can be comprised of a coil of wire which has the large height H2. Similarly, the springy contact 14a in FIG. 8 can be comprised of a wad of wire (as opposed to a coil of wire) which has the small wire thickness T1, and the springy contact 14b in FIG. 8 can be comprised of a wad of wire which has the large wire thickness T2.

Figure 10:
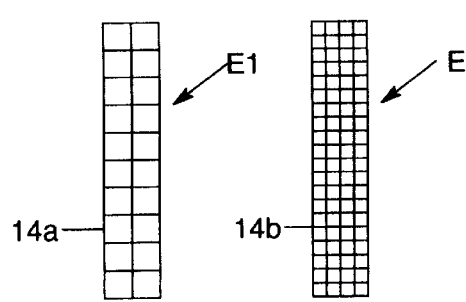
FIG. 10 illustrates a third embodiment of the springy contacts which are in the FIG. 1 module and exert some of the forces that occur in FIG. 2.

In FIG. 10, the springy contact 14a is comprised of an elastomer which is relatively pliant, and the springy contact 14b is comprised of a different elastomer which is relatively stiff. Due to the different elasticities E1 and E2, the springy 14a exerts a relatively small force on the I/O pads which it contacts; whereas the springy contact 14b exerts a relatively large force on the I/O pads which it contacts.

Figure 11:
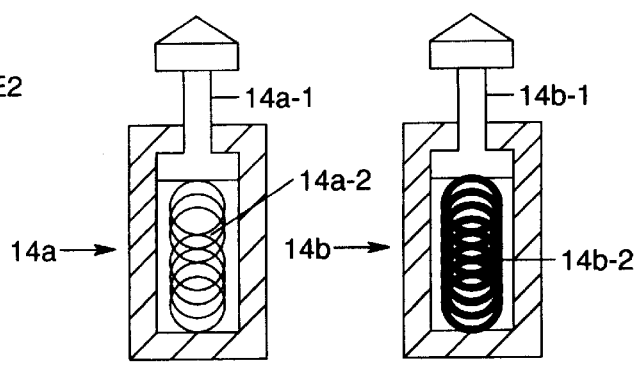
FIG. 11 illustrates a fourth embodiment of the springy contacts which are in the FIG. 1 module and exert some of the forces that occur in FIG. 2.

In FIG. 11, the springy contact 14a is comprised of pogo-pin which includes a piston 14a-1 that pushes against a spring 14a-2 which has a relatively small spring constant. By comparison, the springy contact 14b in FIG. 11 is comprised of another pogo-pin which includes a piston 14b-1 that pushes against a spring 14b-2 which has a relatively large spring constant. Consequently, the springy contact 14a exerts a relatively small force on the I/O pads which it contacts, whereas the springy contact 14b exerts a relatively large force on the I/O pads which it contacts.

Several preferred embodiments of the present invention have now been described in detail. In addition, however, various changes and modifications can be made to those details without departing from the nature and spirit of the invention; and one such modification is shown in FIG. 12.

Figure 12:
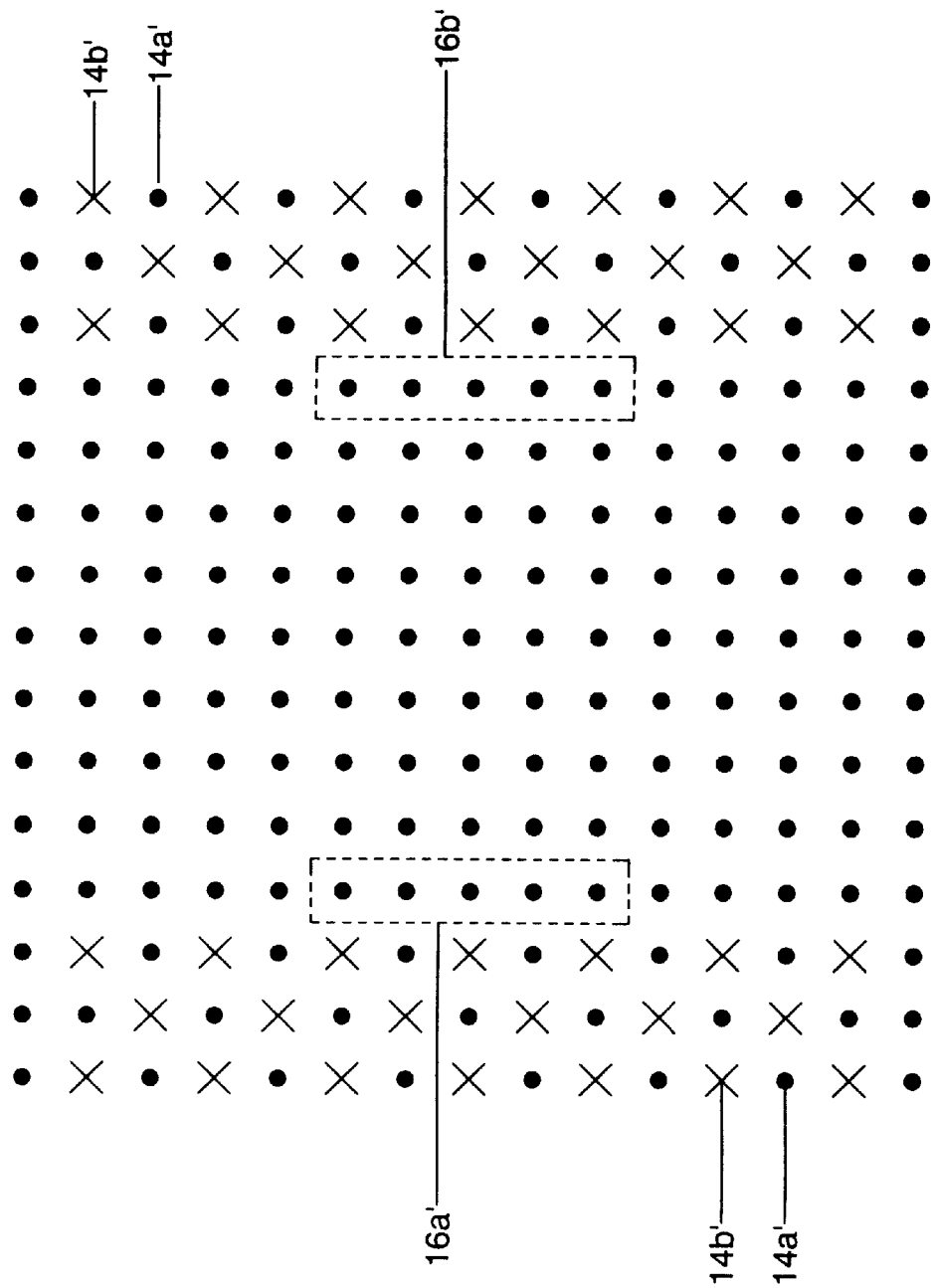
FIG. 12 shows a modification in comparison to FIG. 2, to the locations where the forces are applied to the substrate in the FIG. 1 module.

FIG. 12 is similar to FIG. 2 in that it shows the locations of the forces on the substrate 12 which are exerted by the springy contacts 14a and 14b and by the legs of component 16. However, one modification in FIG. 12 is that the component 16 has only two legs 16a and 16b (rather than four legs) which exert forces on the substrate 12 in two rectangles 16a' and 16b'. Also, another modification in FIG. 12 is that the springy contacts 14a and 14b are arranged in a different pattern than that which occurs in FIG. 2, and this different pattern is indicated by the dots 14a' and the x's 14b'.

Due to all of the forces which are applied to the substrate 12 in FIG. 12, that substrate will bend. However, by utilizing the two types of springy contacts 14a and 14b which respectively exert the small force 14a and the large force 14b on the substrate 12, the maximum deflection of the substrate 12 under the chip 11 will again be less than that which will occur if all of the springy contacts exert the same magnitude force against the substrate. Why, this reduced deflection occurs will now be explained.

In FIG. 12, the two legs 16a and 16b on component 16 push downward in the rectangles 16a' and 16b'; whereas all of the springy contacts 14a which lie between those two legs push upward on the substrate at each of the dots 14a'. Consequently, the substrate 12 will bow upward between the two rectangles 16a' and 16b'; and, the remaining portion of the substrate 12 which lies to the left and right of the rectangles will be deflected downward.

To reduce the upward deflection of the substrate 12 between the two rectangles 16a' and 16b', the large force contacts 14b are interspersed with the small force contacts 14a on the periphery portion of the substrate 12 as shown in FIG. 12 by the x's 14b' and the dots 14a'. Since the large force contacts 14b are mixed with the small force contacts 14a, the total upward force which is exerted on the periphery of the substrate is increased over that which would occur if all of the contacts were of the small force type. Consequently, the periphery portion of the substrate 12 is pushed further upward; and that in turn exerts a moment on the center portion of the substrate 12 which deflects if further downward.

In FIG. 12, the pattern of the small force springy contacts and large force springy contacts which is shown is just one example; and many other patterns could be used as an alternative. In particular, fewer large force contacts 14b can be used as the magnitude of the force which is exerted by each large force contact is increased relative to the magnitude of the force which is exerted by each small force contact 14a; and vice versa. By mixing the large force contacts and small force contacts in different permutations, the peak upward deflection of the substrate 12 between the legs 16a and 16b can be minimized. Preferably, the magnitude of the force which is exerted by each large force contact is at least 50% larger than the force which is exerted by each small force contact.

Also, as another modification, the number of different types of springy contacts which are employed can be more than two. For example, four different types of springy contacts can be used which respectively push against the substrate 12 with the force of 1 ounce, 2 ounces, 3 ounces, and 4 ounces. Preferably, for ease of manufacturing, the number of different types of springy contacts is limited to less than ten.

Figure 13:
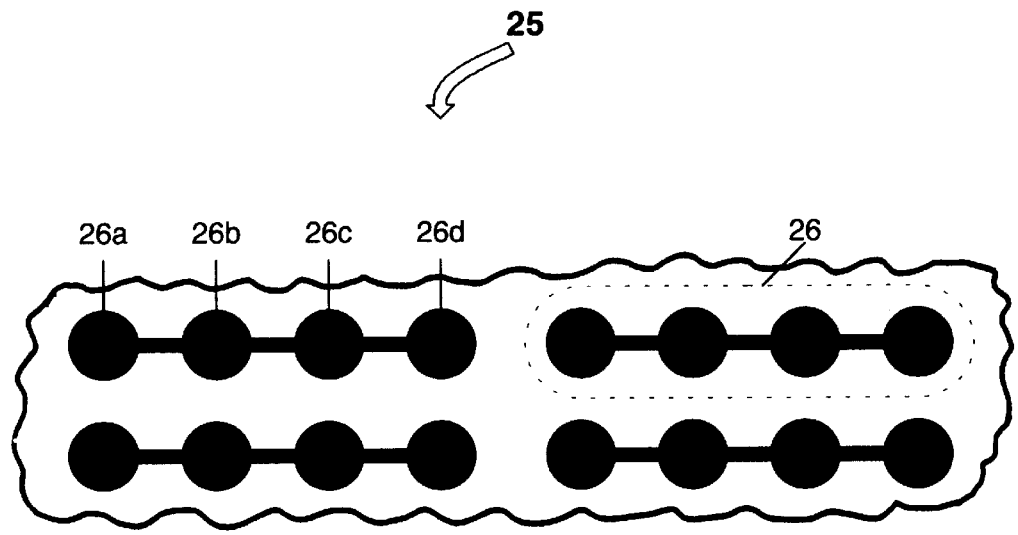
FIG. 13 shows an enlarged top view of a portion of a carrier, for the springy contacts of FIGS. 8–11, which is one modification of a carrier in the FIG. 1 module.
Figure 14:
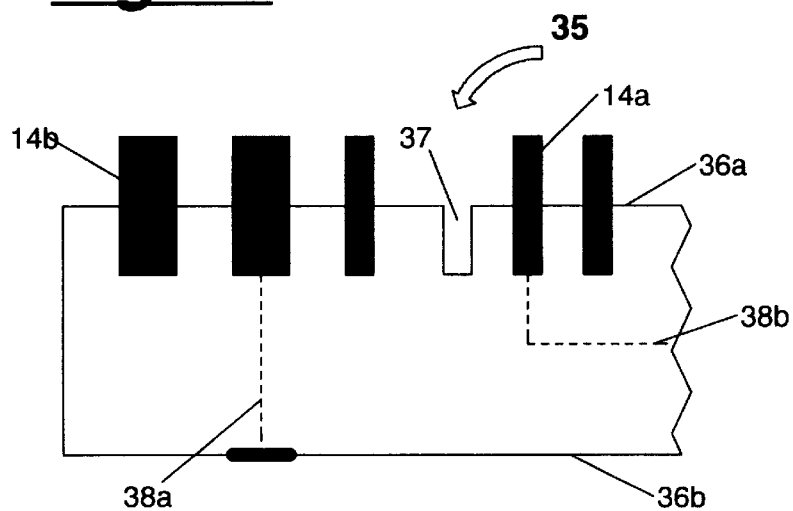
FIG. 14 shows an enlarged side view of a portion of a carrier, for the springy contacts of FIGS. 8–11, which is another modification of a carrier in the FIG. 1 module.

Further, as still another modification the structure of the carrier 15 of the springy contacts in the FIG. 1 embodiment can be changed as shown in FIGS. 13 and 14. In FIG. 13, a blown-up portion of the modified carrier is indicated by reference number 25. This modified carrier 25 is the same as the carrier 15 in FIG. 1 except that it includes a plurality of holes 26 which each hold four of the springy contacts 14a and/or 14b. One springy contact is held in a wide portion 26a of the hole; a second springy contact is held in another wide portion 26b of the hole; a third springy contact is held in another wide portion 26c of the hole; and a fourth springy contact is held in another wide portion 26d of the hole. By comparison, in the carrier 15 of FIG. 1, each hole in the carrier holds only a single springy contact.

As a related variation, the carrier 25 in FIG. 13 can be changed such that each hole 26 holds more than four springy contacts, or holds less than four springy contacts. This modification is made by simply increasing or decreasing the total number of the wide portions 26a–26d in each of the holes 26.

In FIG. 14, a blown-up portion of yet another modified carrier is indicated by reference numeral 35. This modified carrier 35 differs from the carrier 15 in FIG. 1 in that the springy contacts 14a and 14b project from only one planar surface 36a of the carrier.

To implement the FIG. 14 modification, the carrier 35 has holes 37 for holding the springy contacts 14a and 14b which start from the planar surface 36a but only extend part way through the carrier. Electrical signals are transmitted to/from the springy contacts by microscopic conductors which run from the side walls of the holes to a terminal on the opposite planar surface 36b of the carrier, or to a terminal on the side of the carrier. Two such conductors are indicated by reference numerals 38a and 38b.

Also, as another modification, the compressing mechanism shown in FIG. 1 can be replaced with any other mechanism that compresses the springy contacts 14a and 14b against respective I/O pads. Thus, the components 16–19 in FIG. 1 constitute just one particular embodiment of a compressing mechanism for the springy contacts.

Accordingly, since all of the above changes and modifications can be made to the preferred embodiments, it is to be understood that the invention is not limited to the details of any one preferred embodiment but is defined the appended claims.

What is claimed is:

1. An electromechanical subassembly which is comprised of:
    a carrier having a body with a planar surface and multiple holes that extend from said planar surface into said body;
    a plurality of springy electrical contacts which are held in said holes and extend past said planar surface for making respective electrical connections to an external component; and,
    said plurality of springy electrical contacts including electrical contacts of a first type which each exert a small opposing force when compressed by said external component to said planar surface, and electrical contacts of a second type which each exert a larger opposing force when compressed by said external component to said planar surface; and,
    said first and second type springy electrical contacts being arranged in a pattern which reduces deflections in a predetermined critical region of said external component in comparison to the deflections which occur when all of said springy electrical contacts are said first type.

2. A subassembly according to claim 1 wherein each springy contact of said first type is comprised of a wad of wire having a small wire thickness, and each springy contact of said second type is comprised of a wad of wire having a larger wire thickness.

3. A subassembly according to claim 1 wherein each springy contact of said first type is comprised of a wad of wire having a short height, and each springy contact of said second type is comprised of a wad of wire having a taller height.

4. A subassembly according to claim 1 wherein each springy contact of said first type is comprised of a pliable conductive elastomer, and each springy contact of said second type is comprised of a stiffer conductive elastomer.

5. A subassembly according to claim 1 wherein each springy contact of said first type is comprised of a pliable metal, and each springy contact of said second type is comprised of a stiffer metal.

6. A subassembly according to claim 1 wherein each springy contact of said first type is comprised of a piston which compresses a spring that exerts said small opposing force, and each springy contact of said second type is comprised of a piston which compresses a spring that exerts said large opposing force.

7. A subassembly according to claim 1 wherein each springy contact of said first type is comprised of a coil of wire having a small wire thickness, and each springy contact of said second type is comprised of a coil of wire having a larger wire thickness.

8. A subassembly according to claim 1 wherein each springy contact of said first type is comprised of a coil of wire having a short height, and each springy contact of said second type is comprised of a coil of wire having a taller height.

9. A subassembly according to claim 1 wherein said plurality of springy contacts are limited to only said two different types.

10. A subassembly according to claim 1 wherein said small force and said large force differ from each other by a minimum of 50%.

11. A subassembly according to claim 1 wherein said springy contacts include contacts of less than ten different types, each of which exert an opposing force of a different magnitude when compressed to said planar surface.

12. A subassembly according to claim 1 wherein said holes extend through said body to another surface of said carrier, and said springy contacts extend past both surfaces.

13. A subassembly according to claim 1 wherein said holes extend into but not through said body.

14. A subassembly according to claim 1 wherein each one of said holes in said carrier holds only a single springy contact.

15. A subassembly according to claim 1 wherein each one of said holes in said carrier holds more than one springy contact.

* * * * *